United States Patent
Chen et al.

(10) Patent No.: US 10,872,889 B2
(45) Date of Patent: Dec. 22, 2020

(54) SEMICONDUCTOR COMPONENT AND FABRICATING METHOD THEREOF

(71) Applicant: TAIWAN SEMICONDUCTOR MANUFACTURING CO., LTD., Hsinchu (TW)

(72) Inventors: Ting-Yeh Chen, Hsinchu (TW); Wei-Yang Lee, Taipei (TW); Han-Wei Wu, Tainan (TW); Feng-Cheng Yang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/353,933

(22) Filed: Nov. 17, 2016

(65) Prior Publication Data

US 2018/0138172 A1 May 17, 2018

(51) Int. Cl.
*H01L 27/088* (2006.01)
*H01L 21/8234* (2006.01)
*H01L 21/8238* (2006.01)
*H01L 27/092* (2006.01)
*H01L 29/417* (2006.01)

(52) U.S. Cl.
CPC .. *H01L 27/0886* (2013.01); *H01L 21/823418* (2013.01); *H01L 21/823431* (2013.01); *H01L 21/823814* (2013.01); *H01L 21/823821* (2013.01); *H01L 27/0924* (2013.01); *H01L 29/41791* (2013.01)

(58) Field of Classification Search
CPC ............ H01L 29/66795; H01L 29/785; H01L 21/2236; H01L 21/3065; H01L 21/3081; H01L 21/31051; H01L 21/31111; H01L 21/31144; H01L 21/3115; H01L 21/31155; H01L 21/823418; H01L 21/823431; H01L 21/82347; H01L 29/7843; H01L 29/1054; H01L 27/0886; H01L 29/7878
USPC .................................................... 438/164
See application file for complete search history.

(56) References Cited

U.S. PATENT DOCUMENTS

| | | |
|---|---|---|
| 7,407,847 B2 * | 8/2008 | Doyle ................. H01L 29/7853 438/164 |
| 7,667,271 B2 | 2/2010 | Yu et al. |
| 8,362,575 B2 | 1/2013 | Kwok et al. |
| 8,367,498 B2 | 2/2013 | Chang et al. |
| 8,440,517 B2 | 5/2013 | Lin et al. |
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |

(Continued)

*Primary Examiner* — Edward Chin
(74) *Attorney, Agent, or Firm* — McClure, Qualey & Rodack, LLP (57) ABSTRACT

A semiconductor component includes a substrate having a dense zone and a less-dense zone, at least one first FinFET device disposed on the dense zone, and at least one second FinFET device disposed on the less-dense zone, in which a width of a first source/drain region of the first FinFET device is smaller than a width of a second source/drain region of the second FinFET device.

20 Claims, 9 Drawing Sheets

(56) References Cited

U.S. PATENT DOCUMENTS

| | | | |
|---|---|---|---|
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 9,202,919 B1* | 12/2015 | Liu | H01L 29/66795 |
| 9,305,883 B2* | 4/2016 | Naczas | H01L 29/41791 |
| 9,620,503 B1* | 4/2017 | Liao | H01L 27/0886 |
| 9,673,301 B1* | 6/2017 | Al-Amoody | H01L 21/31155 |
| 9,748,245 B1* | 8/2017 | Cheng | H01L 29/6681 |
| 2011/0068407 A1 | 3/2011 | Yeh et al. | |
| 2013/0011983 A1 | 1/2013 | Tsai et al. | |
| 2014/0084381 A1* | 3/2014 | Yeh | H01L 28/20 257/380 |
| 2014/0217517 A1* | 8/2014 | Cai | H01L 29/41791 257/401 |
| 2014/0252412 A1 | 9/2014 | Tsai et al. | |
| 2015/0041855 A1* | 2/2015 | Liao | H01L 29/161 257/192 |
| 2016/0079248 A1* | 3/2016 | Basker | H01L 27/10879 257/347 |
| 2017/0062613 A1* | 3/2017 | Sung | H01L 29/7851 |

\* cited by examiner

SEMICONDUCTOR COMPONENT AND FABRICATING METHOD THEREOF

BACKGROUND

The semiconductor integrated circuit (IC) industry has experienced rapid growth. Over the course of the growth, functional density of the semiconductor devices has increased with decrease of device feature size or geometry. The scaling down process generally provides benefits by increasing production efficiency, reducing costs, and/or improving device performance. However, such scaling down has also increased complexity of the IC manufacturing processes.

The smaller feature size is the use of multigate devices such as fin field effect transistor (FinFET) devices. FinFETs are so called because a gate is formed on and around a "fin" that extends from the substrate. FinFET devices may allow for shrinking the gate width of device while providing a gate on the sides and/or top of the fin including the channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
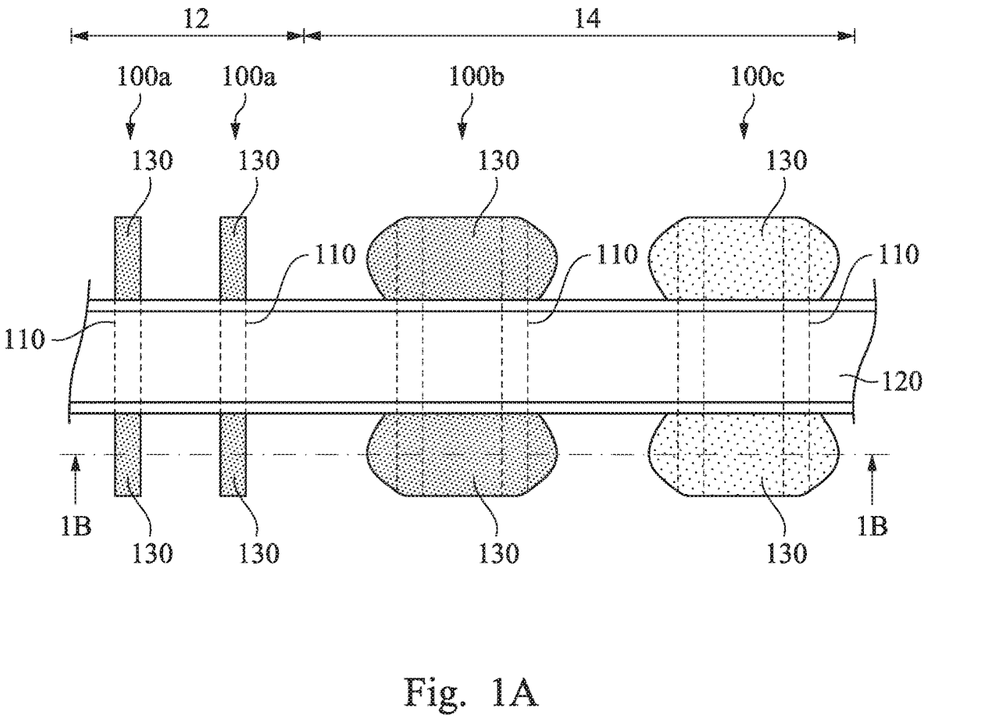
FIG. 1A is a schematic top view of semiconductor component having fin field effect transistor (FinFET) devices in accordance with some embodiments of the disclosure.
Figure 1B:
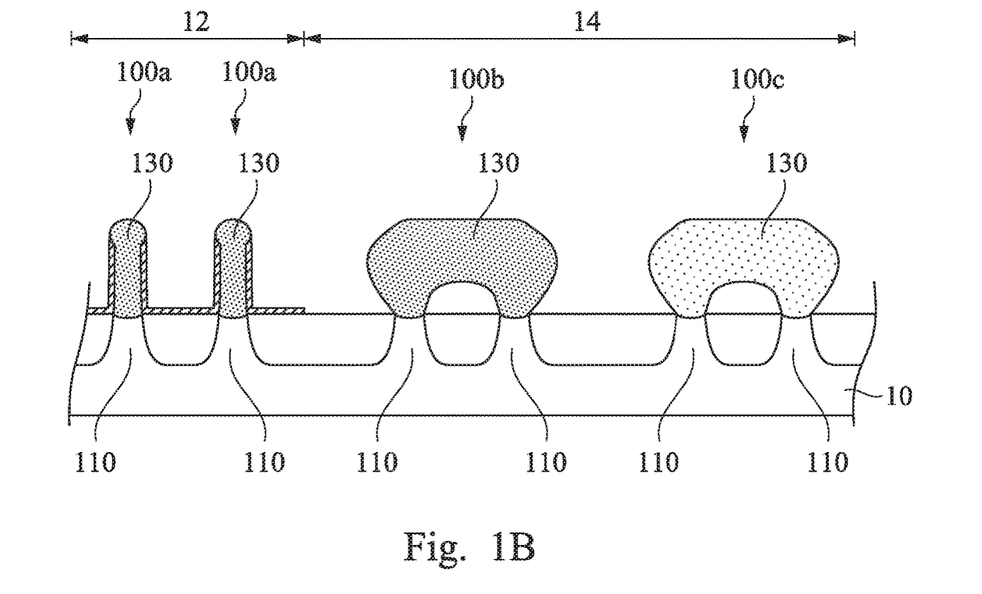
FIG. 1B is a schematic cross-sectional view taken along a section line 1B of FIG. 1A.

Reference is made to FIGS. 1A and 1B, in which FIG. 1A is a schematic top view of semiconductor component having fin field effect transistor (FinFET) devices in accordance with some embodiments of the disclosure, and FIG. 1B is a schematic cross-sectional view taken along a section line 1B of FIG. 1A. A plurality of FinFET devices 100a-100c are formed on a substrate 10. The FinFET devices 100a-100c include a plurality of fins 110, a gate 120 crossing portions of the fins 110. Each of the FinFET devices 100a-100c includes two source/drain regions 130 arranged at opposite sides of the gate 120, and a channel region disposed between the source/drain regions 130. In some embodiments, at least one of FinFET device 100a is arranged at a dense zone 12 of the substrate 10, and the FinFET devices 100b and 100c are arranged at a less-dense zone 14 of the substrate 10. The device density at the dense zone 12 is higher than the device density at the less-dense zone 14.

In some embodiments, the source/drain regions are formed by expitaxy processes. In the less-dense zone 14, the situation of merging adjacent epitaxy structure as the source/drain regions 130 is permitted. However, in the dense zone 12, each of the expitaxy structures represents a source/drain region 130, and the situation of merging adjacent epitaxy structures is unwanted. Therefore, the present disclosure provides a self-align epi growth methodology for forming the source/drain regions 130 of the FinFET device 100a at the dense zone 12.

Figure 2:
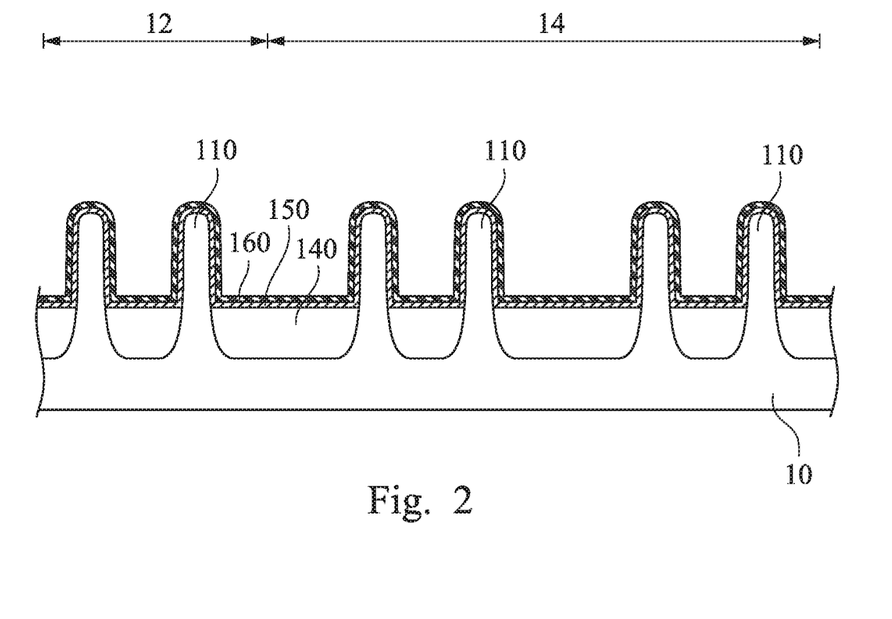
FIGS. 2-14 are cross-sectional views at various stages of a method of manufacturing a semiconductor component having FinFET devices in accordance with some embodiments of the present disclosure.

Reference is made to FIGS. 2-14, in which FIGS. 2-14 are cross-sectional views at various stages of a method of manufacturing a semiconductor component having FinFET devices in accordance with some embodiments of the present disclosure. Referring to FIG. 2, a plurality of fins 110 are formed on the substrate 10. The substrate 10 is a material layer that serves as a basis. One should note that some of the structures have been omitted for the purpose of simplicity and clarity. In some embodiments, the substrate 10 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof. In some other embodiments, the substrate 10 is a bulk silicon substrate that may be undoped or doped. In some embodiments, the substrate 10 may include a dense zone 12 and a less-dense zone, in which the device density at the dense zone 12 is higher than the device density at the less-dense zone 14.

In some embodiments, the substrate 10 and the fins 110 are made of a same material, and the substrate 10 and the fins 110 are formed by selectively etching a thick substrate. For example, in the embodiments, the thick substrate is firstly provided, and portions of the thick substrate are removed to define the fins 110 protruding from the substrate 10. However, other techniques for fabricating the fins 110 are possible. In some embodiments, the portions of the thick substrate are removed by photolithography and etching process to form trenches, and thus to define the fins 110.

In some embodiments, the substrate 10 further includes isolation structures 140 arranged between the fins 110, such as shallow trench isolation (STI) structures. The isolation structure 140 is configured to separate the adjacent fins 110. In some embodiments, the isolation structures 140 are made of a dielectric material, such as silicon oxide, silicon nitride, silicon oxynitride, fluoride-doped silicate glass, a low-k dielectric material, any other suitable dielectric material or a combination thereof.

After the fins 110 are formed on the substrate 10, at least one insulating layer 150 is formed on the fins 110 and on the substrate 10. The insulating layer 150 is conformally formed on the fins 110 and on the substrate 10. The insulating layer 150 can be mono-layer or multi-layers. In some embodiments, the insulating layer 150 is formed by performing one or more deposition processes, such as chemical vapor deposition (CVD) processes. The insulating layer 150 can be made of a low dielectric constant (low-k) material. For example, the insulating layer 150 can be a silicon oxycarbonitride film (SiOCN film).

After the insulating layer 150 is formed on the fins 110 and on the substrate 10, a capping layer 160 is further formed on the insulating layer 150. The capping layer 160 is conformally formed on the fins 110 and on the substrate 10. In some embodiments, the capping layer 160 is formed by performing one or more deposition processes, such as CVD processes. The capping layer 160 is made of a low-k material, but the material of the capping layer 160 is different from the material of the insulating layer 150, such that an etching selectivity can be made between the insulating layer 150 and the capping layer 160. In some embodiments, the capping layer 160 is a nitride layer, such as a silicon nitride (SiN) layer.

Figure 3:
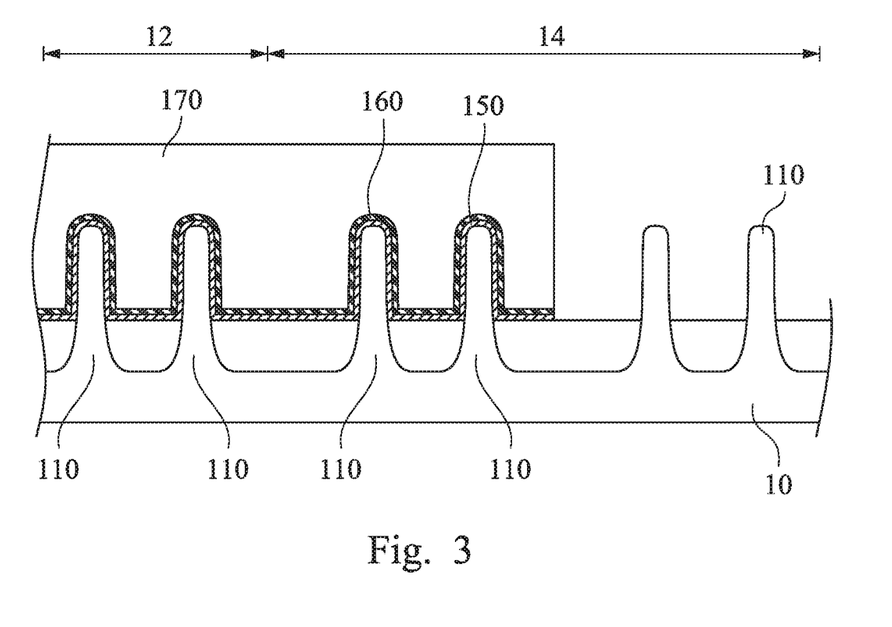

Referring to FIG. 3, at least portions of the insulating layer 150 and the capping layer 160 at the less-dense zone 14 of the substrate 10 are removed, thus at least one of the fins 110 is uncovered by the insulating layer 150 and the capping layer 160. In some embodiments, the portions of the insulating layer 150 and the capping layer 160 are removed by a photolithography and etching process. In some embodiments, the photolithography process includes forming a photoresist layer 170 overlying the capping layer 160, exposing the photoresist layer 170 to a pattern, performing a post-exposure bake process, and developing the photoresist layer 170 to form a masking element. In some embodiments, the etching process with the masking element includes performing several etching processes.

Figure 4:
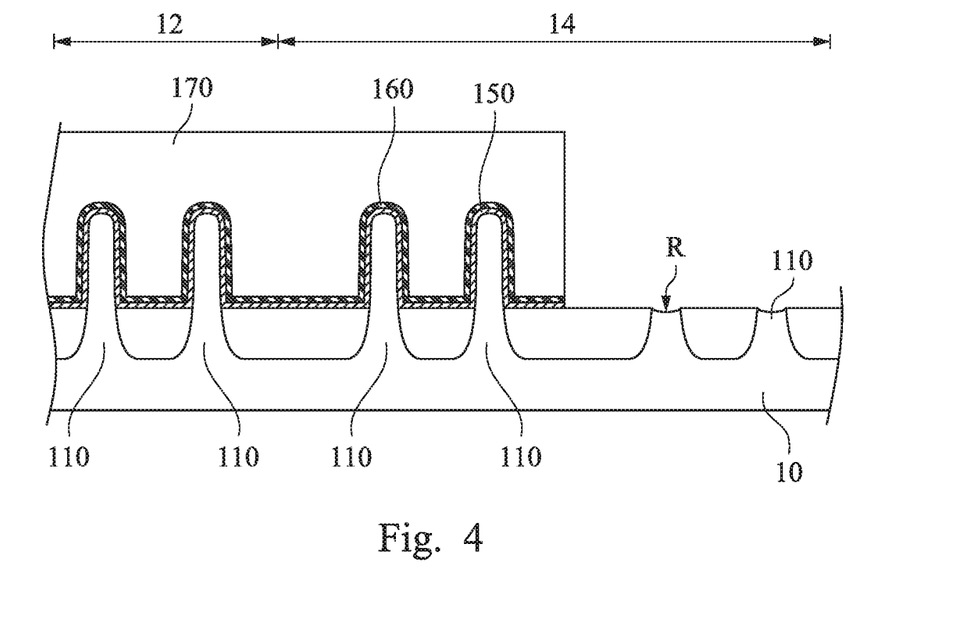

Referring to FIG. 4, portions of the uncovered fins 110 protruding from the substrate 10 are removed. In some embodiments, the uncovered fins 110 are recessed during the removing process, thus concave surfaces are formed at the top of the uncovered fins 110 and can be regarded as recesses R in the substrate 10.

Figure 5:
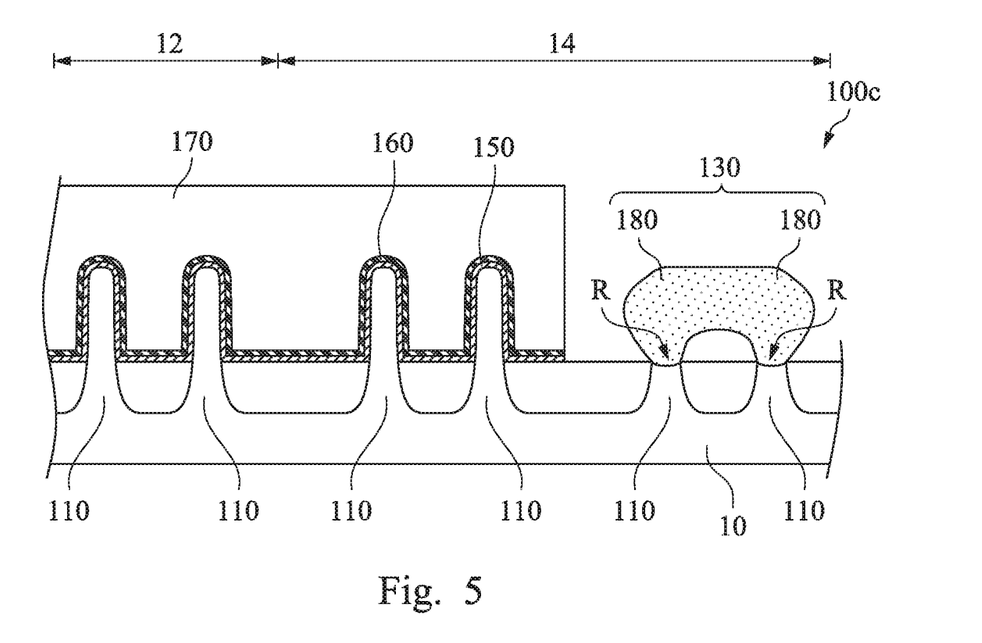

Referring to FIG. 5, an epitaxy process is performed to grow a plurality of epitaxy structures 180 in the recesses R. In some embodiments, the epitaxy structures 180 are epitaxially grown protruding from the substrate 10. In some embodiments, since the pitch between adjacent fins 110 is very small, some of the adjacent epitaxy structures 180 may be merged as a dome structure and bridge two of adjacent fins 110. The merged epitaxy structures 180 as a whole is utilized as the source/drain region 130 of the FinFET device 100c.

In some embodiments, lattice constants of the epitaxy structures 180 are different from lattice constants of the fins 110, and the epitaxy structures 180 are strained or stressed to enable carrier mobility of the FinFET device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fins 110. Thus, a strained channel can be achieved to increase carrier mobility and enhance device performance. One or more annealing processes may be performed to activate the epitaxy structures 180. The annealing processes include rapid thermal annealing (RTA) and/or laser annealing processes.

In some embodiments, during the formation of the epitaxy structures 180, n-type impurities such as phosphorous or arsenic may be doped with the proceeding of the epitaxy. For example, when the epitaxy structures 180 include SiC or Si, n-type impurities are doped. In some other embodiments, during the formation of the epitaxy structures 180, p-type impurities such as boron or $BF_2$ may be doped with the proceeding of the epitaxy. For example, when the epitaxy structures 180 include SiGe, p-type impurities are doped. The merged epitaxy structures 180 are of the same doping type. The shape of the epitaxy structures 180 is determined according to the doping type of the epitaxy structures 180. For example, when the epitaxy structures 180 are of n-type, the top portions the epitaxy structures 180 can have at least one substantially facet surface; when the epitaxy structures 180 are of p-type, the top portions of the epitaxy structures 180 can have at least one non-facet (or round) surface.

Figure 6:
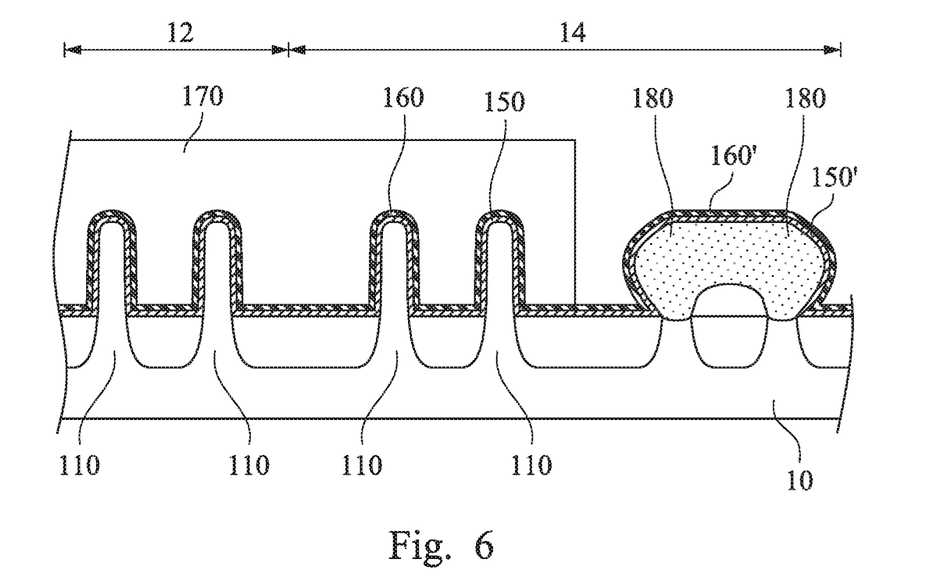

Referring to FIG. 6, another insulating layer 150' and another capping layer 160' are sequentially formed on the epitaxy structures 180 and on the uncovered portion of the substrate 10. After the insulating layer 150' and the capping layer 160' are formed, the photoresist layer 170 is removed. In some embodiments, the insulating layer 150' may have substantially the same material and the same thickness as the insulating layer 150, and the capping layer 160' may have substantially the same material and the same thickness as the capping layer 160. In some other embodiments, the insulating layer 150' and the insulating layer 150 are made of different materials, and the capping layer 160' and the capping layer 160 are made of different materials. The insulating layer 150 and the insulating layer 150' (referring as insulating layer 150 hereafter) are continuous and conformally formed on the substrate 10, the fins 110, and the epitaxy structures 180. The capping layer 160 and the capping layer 160' (referring as capping layer 160 hereafter) are continuous and conformally formed on the insulating layer 150.

Figure 7:
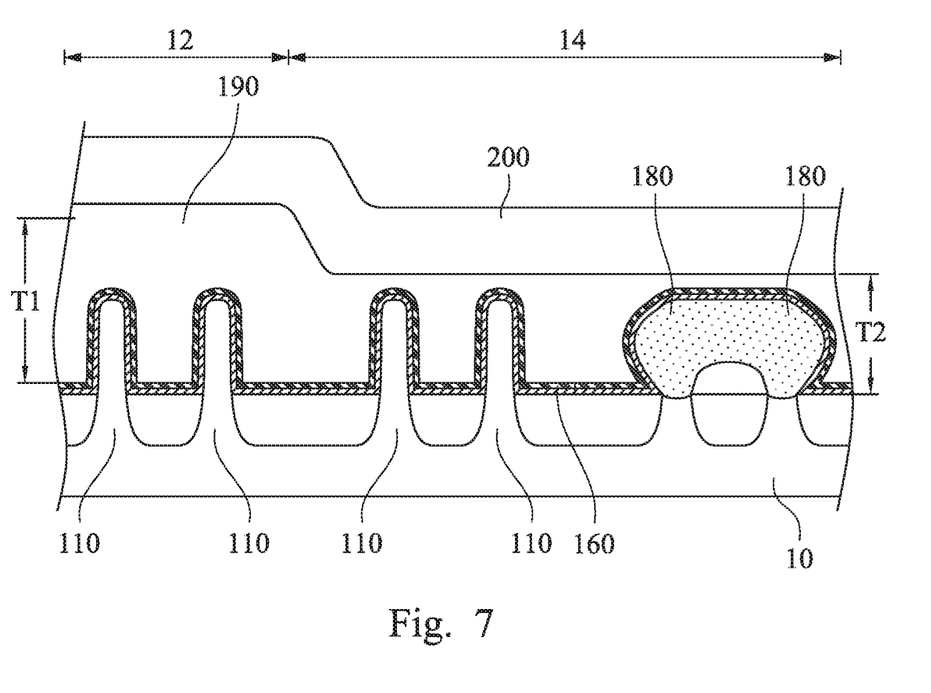

Referring to FIG. 7, a dielectric layer 190 is formed on the capping layer 160. In some embodiments, the dielectric layer 190 is a barrier and anti-reflective coating (BARC) layer and is made of, for example, silicon oxynitride or an organic material. The dielectric layer 190 can be formed by a deposition process. Since the device density at the dense zone 12 is higher than the device density at the less-dense zone 14, the thickness T1 of the dielectric layer 190 at the dense zone 12 is thicker than the thickness T2 of the dielectric layer 190 at the less-dense zone 14. Namely, the dielectric layer 190 includes a first part filling the spaces between the fins 110 at the dense zone 12, and a second part filling the spaces between the fins 110 and the epitaxy structures 180 at the less-dense zone 14, in which the first part is thicker than the second part. After the dielectric layer 190 is formed, another photoresist layer 200 is formed on the dielectric layer 190. In some embodiments, the dielectric layer 190 and the photoresist layer 200 are not polished.

Figure 8:
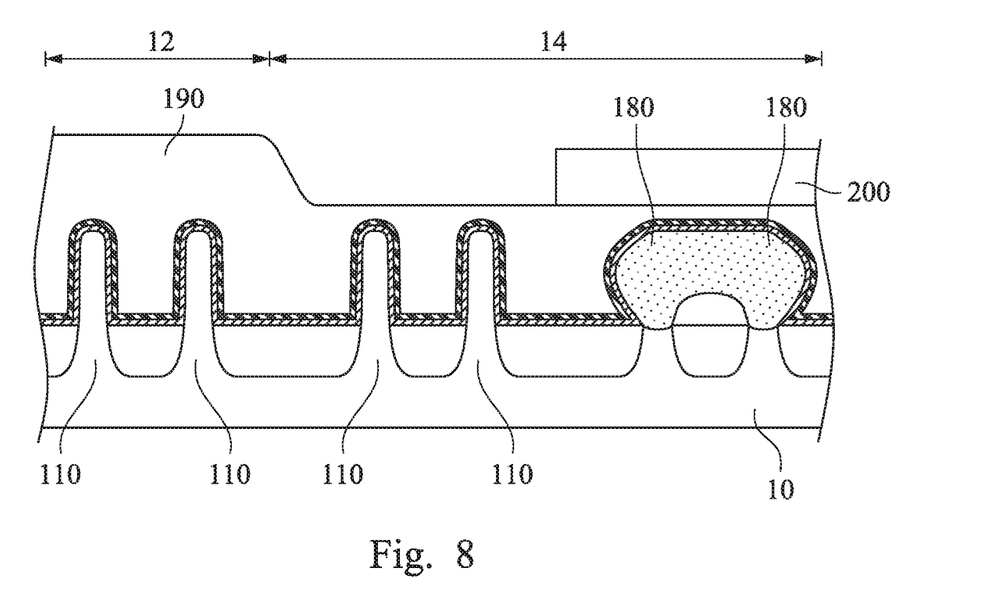

Referring to FIG. 8, the photoresist layer 200 is patterned. In some embodiments, the photoresist layer 200 is patterned by a photolithography and etching process. A portion of the photoresist layer 200 is removed, and another portion of the photoresist layer 200 is remained on the epitaxy structures 180 as a masking element. Namely, the fins 110 at the dense zone 12 are not covered by the photoresist layer 200, a part of the fins 110 at the less-dense zone 14 are not covered by the photoresist layer 200, and the epitaxy structures 180 are covered by the photoresist layer 200.

Figure 9:
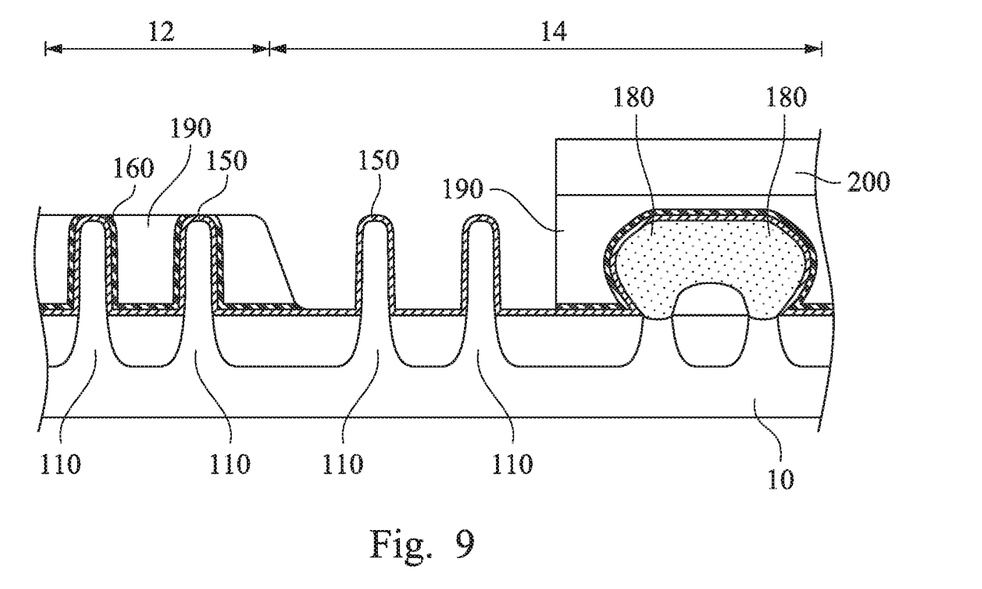

Referring to FIG. 9, a removing process is performed to remove a portion of the dielectric layer 190 which is not covered by the photoresist layer 200. In some embodiments, the removing process can be a dry etching process and stop while reaching the insulating layer 150. Because of the ununiformed thickness of the dielectric layer 190, some of the dielectric layer 190 filling between the spaces of the fins 110 at the dense zone 12 is still remained on the substrate 10 after the removing process is performed. At the dense zone 12, portions of the capping layer 160 at the top of the fins 110 are removed, portions of the insulating layer 150 at the top of the fins 110 are exposed, and other portions of the insulating layer 150 and the capping layer 160 are covered by the dielectric layer 190. At the less-dense zone 14, the epitaxy structures 180 are covered by the photoresist layer 200, the fins 110 next to the epitaxy structures 180 are not covered by the photoresist layer 200, and the portions of the dielectric layer 190 and the capping layer 160 uncovered by the photoresist layer 200 are removed. Therefore, the fins 110 at the dense zone 12 are covered by the insulating layer 150 and are surrounded by the capping layer 160 and the dielectric layer 190. The fins 110 at the less-dense zone 14 are covered by the insulating layer 150.

Figure 10:
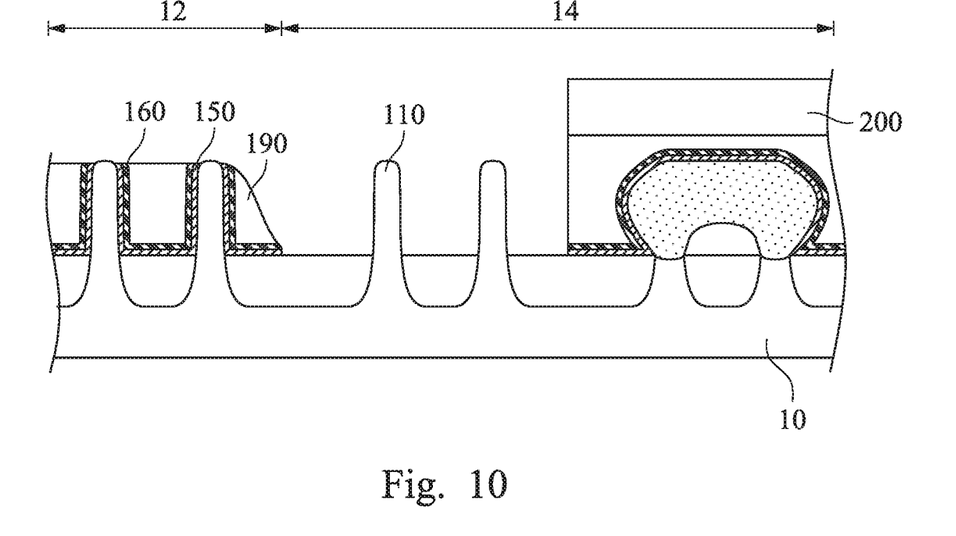

Referring to FIG. 10, an additional removing process is performed to remove the portions of the insulating layer 150 uncovered by the dielectric layer 190. In some embodiments, the fins 110 at the less-dense zone 14 and uncovered by the photoresist layer 200 are not covered by the insulating layer 150, and the top portions of the fins 110 at the dense zone 12 are not covered by the insulating layer 150. The process of removing the insulating layer 150 can be performed by a wet etching process or a dry etching process.

Figure 11:
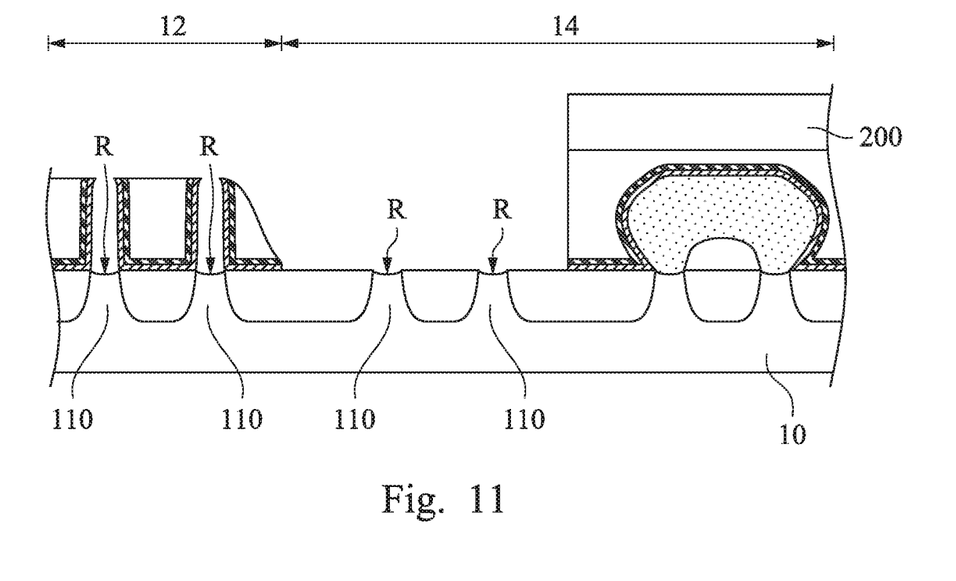

Referring to FIG. 11, portions of the uncovered fins 110 protruding from the substrate 10 are removed. In some embodiments, the uncovered fins 110 are recessed during the removing process, thus a concave surface is formed at the top of the exposed fins 110 and can be regarded as a recess R in the substrate 10.

Figure 12:
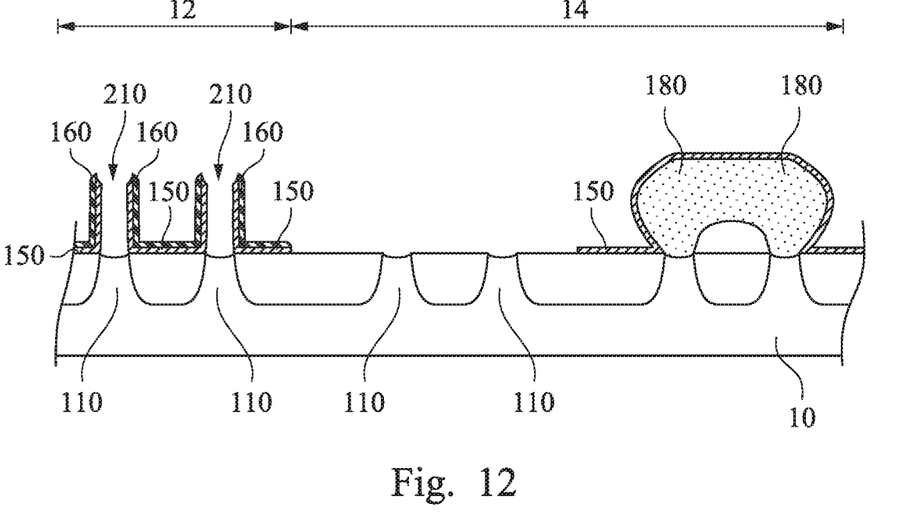

Referring to FIG. 12, the photoresist layer and the dielectric layer are removed. In some embodiments, the capping layer at the less-dense zone 14 is removed while the capping layer 160 at the dense zone 12 is still remained. That is, the material of the capping layer (e.g. the capping layer 160' in FIG. 6) on the epitaxy structures 180 may be different from the material of the capping layer 160 on the fins 110 at the dense zone 12. At the dense zone 12, portions of the insulating layer 150 and the capping layer 160 are protruded from the substrate 10 and are arranged at opposite sides of the fins 110 in pairs. The portions of the insulating layer 150 and the capping layer 160 stand on the substrate 10 and thereby forming trenches 210 therebetween. In some embodiments, the width of the trenches 210 is substantially the same as the width of the removing portions of the fins 110.

Figure 13:
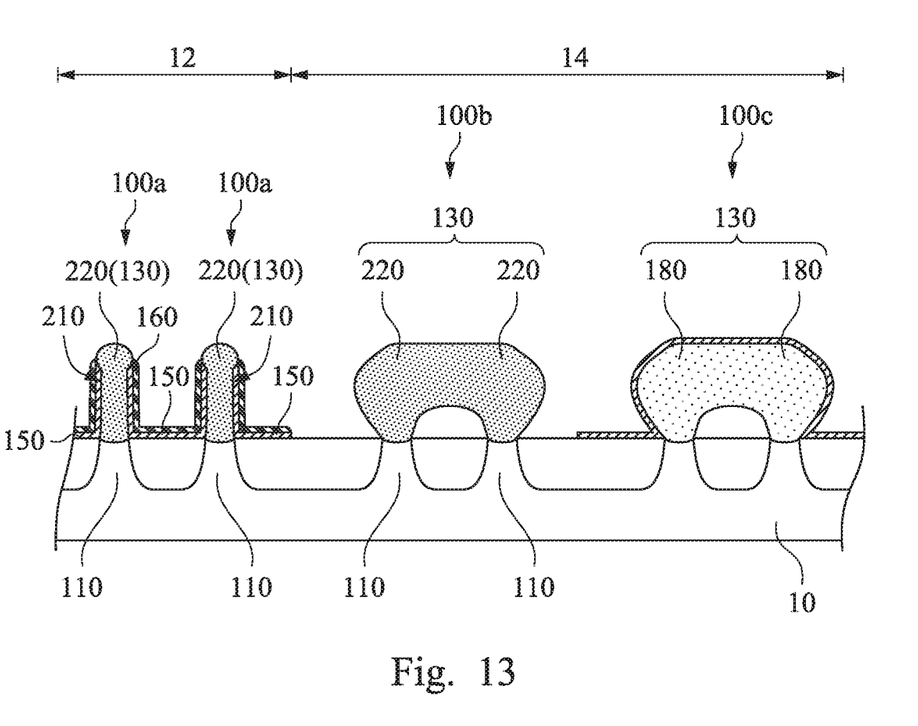

Referring to FIG. 13, an additional epitaxy process is performed to grow a plurality of epitaxy structure 220 in the recesses R and in the trenches 210. The conductive type of the epitaxy structures 220 is different from the conductive type of the epitaxy structures 180. Namely, the epitaxy structures 220 are n-type doped since the epitaxy structures 180 are p-type doped, or the epitaxy structures 220 are p-type doped since the epitaxy structures 180 are n-type doped. Details of the epitaxy process are discussed in FIG. 5.

At the less-dense zone 14, the epitaxy structures 220 are formed on the uncovered fins 110 and are protruded from the substrate 10. In some embodiments, since the pitch between adjacent fins 110 is very small, some of the adjacent epitaxy structures 220 may be merged as a whole. The merged epitaxy structures 220 as a whole is utilized as the source/drain region 130 of the FinFET device 100b.

At the dense zone 12, the epitaxy structures 220 are formed on the uncovered fins 110 and fill the trenches 210. The shape of the epitaxy structures 220 is controlled by the trenches 210. For example, the trenches 210 may have a width defined between the pair of portions of the insulating layer 150, in which the insulating layer 150 is conformally formed on sidewalls of the fins 110 (as shown in FIG. 2). That is, the width of the trenches 210 is substantially the same as the width of the removing portions of the fins 110, and the epitaxy structures 220 in the trenches 210 have the width substantially the same as the width of the removing portions of the fins 110. Therefore, the epitaxy structures 220 at the dense zone 12 are in the shape of fins. Since the shape and the width of the epitaxy structures 220 are controlled by the trenches 210, the epitaxy structures 220 at the dense zone 12 are isolated from each other. Each of the epitaxy structures 220 is utilized as a source/drain region 130 of each of the FinFET devices 100a.

Figure 14:
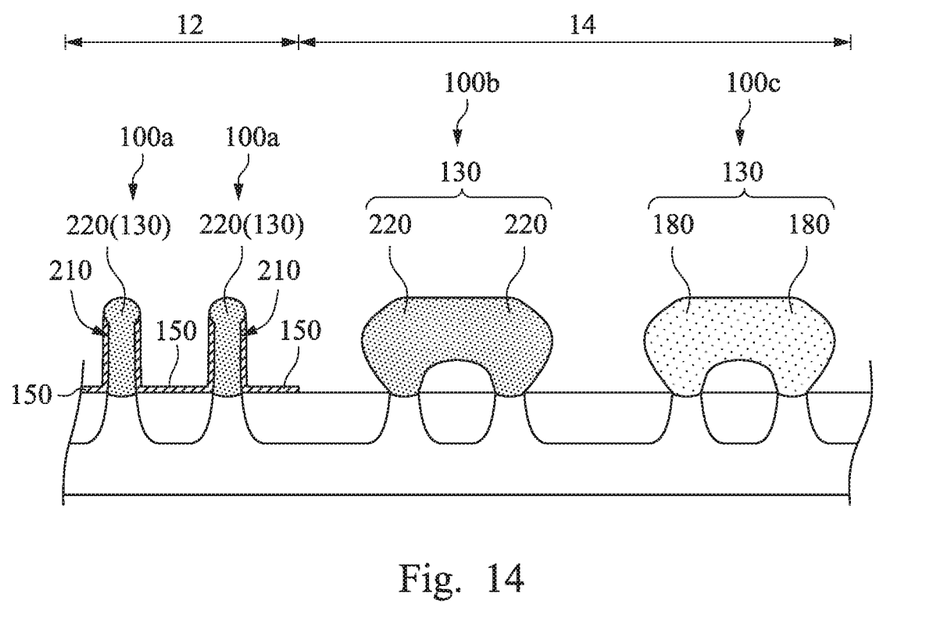

Referring to FIG. 14, the remaining portions of the capping layer on the epitaxy structures 220 and the remaining portion of the insulating layer on the epitaxy structure 180 are removed. The processes of removing the capping layer and removing the insulating layer can be performed simultaneously or sequentially. Since the capping layer and the underlying insulating layer 150 are made of different materials, the insulating layer 150 aside the epitaxy structures 220 are remained. The insulating layer 150 can be regarded as sidewall spacers of the epitaxy structures 220 at the dense zone 12.

Reference is made to FIG. 1A, FIG. 1B, and FIG. 14. In some embodiments, the substrate 10 may have the dense zone 12 and less-dense zone 14. The device density of the dense zone 12 is higher than the device density of the less-dense zone 14. Various types of the FinFET devices 100a-100c are arranged on the substrate 10. For example, the dense zone 12 is arranged with at least one of the FinFET device 100a, and the less-dense zone 14 is arranged with at least one FinFET device 100b and at least one FinFET device 100c, in which the conductive type of the FinFET device 100b is different from that the conductive type of the FinFET device 100c. Each of the FinFET devices 100a at the dense zone 12 includes the fin 110, a section of the gate 120 crossing the fin 110, and a pair of the epitaxy structures 220 as source/drain regions 130 disposed at opposite sides of the section of the gate 120. The shape of the epitaxy structures 220 is controlled by the trenches 210 defined by the portions of the insulating layer 150 and are formed as fin shape, thus the epitaxy structures 220 on adjacent fins 110 are isolated from each other.

On the other hand, the FinFET device 100b at the less-dense zone 14 includes two fins 110, a section of the gate 120 crossing the fins 110, and the epitaxy structures 220 disposed at opposite sides of the gate 120, in which the epitaxy structures 220 on the adjacent fins 110 are merged as the source/drain regions 130 of the FinFET device 100b. Similarly, the FinFET device 100c at the less-dense zone 14 includes two fins 110, a section of the gate 120 crossing the fins 110, and the epitaxy structures 180 disposed at opposite sides of the gate 120, in which the epitaxy structures 180 on the adjacent fins 110 are merged as the source/drain regions 130 of the FinFET device 100c.

The width of each of the epitaxy structures 220 (as source/drain regions of the FinFET devices 100a) at the dense zone 12 is smaller than the width of the epitaxy structures 220/180 (as source/drain regions of FinFET devices 100b and 100c) at the less-dense zone 14. For example, the source/drain region 130 of the FinFET devices 100b or 100c is at least two times wider than the source/drain region 130 of the FinFET device 100a. Therefore, the size of each of the FinFET devices 100a at the dense zone 12 is smaller than the size of each of the FinFET devices 100b and 100c at the less-dense zone 14.

Figure 15:
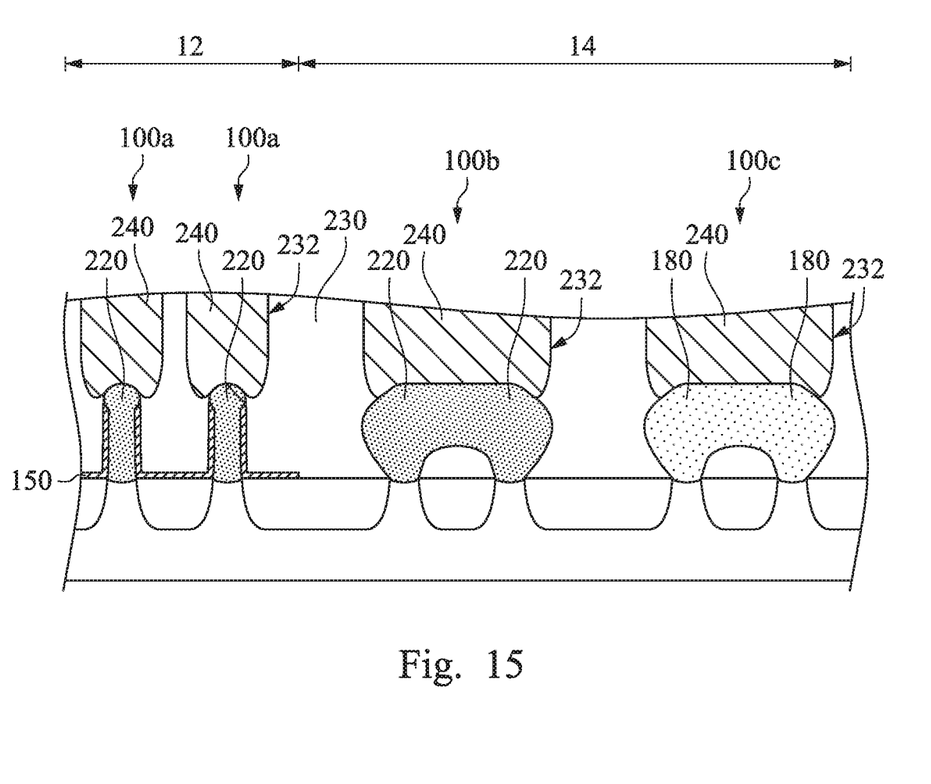
FIGS. 15 and 16 are schematic cross-sectional views of the semiconductor component having FinFET devices in accordance with some embodiments of the disclosure.
Figure 16:
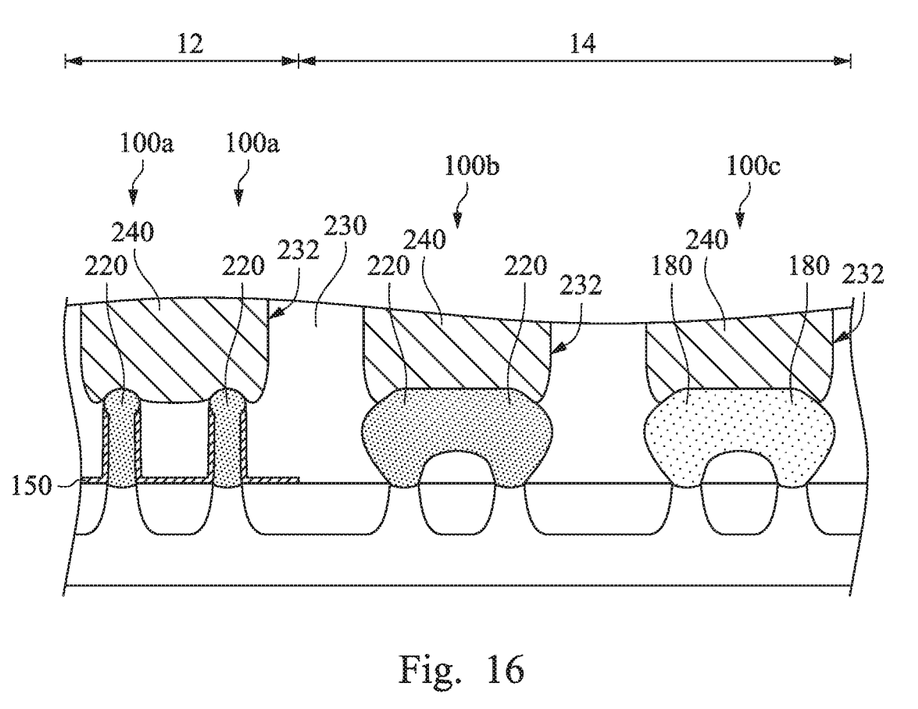

Reference is made to FIGS. 15 and 16, which are schematic cross-sectional views of the semiconductor component having FinFET devices in accordance with some embodiments of the disclosure. An interconnection structure is formed on the FinFET devices 100a-100c. For example, another dielectric layer 230 is formed on the FinFET devices 100a-100c, and a plurality of contacts 240 are formed in the dielectric layer 230 and are in contact with the source/drain regions (e.g. the epitaxy structures 220 and 180). The contacts 240 connected to the epitaxy structures 220 and 180 are utilized source/drain contacts of the FinFET devices 100a-100c. In some embodiments, the dielectric layer 230 is etched to form a plurality of openings 232 therein. The openings 232 are formed to expose the epitaxy structures 220 and 180. In some embodiments, the openings 232 expose the top portions of the epitaxy structures 220 and 180. The contacts 240 can be deposited and fill the openings 232. The material of contacts 240 includes metal. In some embodiments, the material of the contacts 240 includes Cu, W, Al, or an alloy thereof. In some embodiment, a barrier layer is optionally deposited on sidewalls of the openings 232 for preventing the metal from diffusing. The barrier layer is a thin and resistive diffusion layer, and the material of the barrier layer includes Ta, TaN, TiN, or any other barrier material. The interfaces between the contacts 240 and the epitaxy structures 220 and 180 include one or more curved sections, for example, portions of the epitaxy structures 220 and 180 may be embedded in the contacts 240. Therefore, the contact area between the contacts 240 and the epitaxy structures 220 and 180 can be increased, and the resistance of the interconnection structure can be reduced accordingly.

In some embodiments, the contacts 240 at the dense zone 12 are respectively connected to the source/drain regions 130 of the FinFET devices 100a, as shown in FIG. 15, such that the FinFET devices 100a can be controlled individually. In some other embodiments, at least one the contacts 240 at the dense zone 12 is connected to plural source/drain regions 130 of the FinFET devices 100a, as shown in FIG. 16, such that some of the FinFET devices 100a can be controlled simultaneously.

The present disclosure provides a semiconductor component having FinFET devices. The FinFET devices may include at least one first FinFET device disposed at the dense zone, and at least one second FinFET device disposed at the less-dense zone, in which the epitaxy structures of the first FinFET device and the second FinFET are different in shape. For example, the epitaxy structure of the first FinFET device is fin shaped, and thus the width of the epitaxy structure of the first device is smaller than the width of the epitaxy structure of the second FinFET device.

According to some embodiments of the disclosure, a semiconductor component includes a substrate having a dense zone and a less-dense zone, at least one first FinFET device disposed on the dense zone, and at least one second FinFET device disposed on the less-dense zone, in which a width of a first source/drain region of the first FinFET device is smaller than a width of a second source/drain region of the second FinFET device.

According to some embodiments of the disclosure, a semiconductor component includes a substrate, a plurality of fins disposed on the substrate, at least two first epitaxy structures disposed on adjacent two of the fins, and at least two of second epitaxy structures disposed on other adjacent two of the fins. The first epitaxy structures are isolated from each other, and the second epitaxy structures are merged.

According to some embodiments of the disclosure, a method of fabricating a FinFET device includes forming at least one fin protruded from a substrate, forming an insulating layer on the fin conformally, and removing a portion of the insulating layer. A top portion of the fin is not covered by the insulating layer, and portions of the insulating layer are disposed at sidewalls of the fin. The method further includes removing a portion of the fin, in which a trench is formed between the portions of the insulating layer, and growing an epitaxy structure in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor component, comprising:
   a substrate having a first zone and a second zone;
   at least one first FinFET device disposed on the first zone and including a fin and an epitaxy source/drain region on the fin;
   at least one second FinFET device disposed on the second zone and including a first fin and an epitaxy source/drain region on the first fin;
   an isolation structure at least partially between the fin of the first FinFET device and the first fin of the second FinFET device; and
   an insulating layer conformably on a sidewall of the epitaxy source/drain region of the first FinFET device, wherein a sidewall of the epitaxy source/drain region of the second FinFET device is free from coverage by the insulating layer, a top surface of the insulating layer is lower than a top surface of the epitaxy source/drain region, and a bottom of the insulating layer is higher than a top of the isolation structure.

2. The semiconductor component of claim 1, wherein the width of the epitaxy source/drain region of the second FinFET device is at least two times wider than the width of the epitaxy source/drain region of the first FinFET device.

3. The semiconductor component of claim 1, wherein the epitaxy source/drain region of the first FinFET device is a fin structure.

4. The semiconductor component of claim 1, wherein the second FinFET device comprises a second fin, and the epitaxy source/drain region of the second FinFET device is a dome structure and bridges the first fin and the second fin.

5. The semiconductor component of claim 1, wherein the fin of the first FinFET device has a concave top surface, and the epitaxy source/drain region of the first FinFET device is disposed on the concave top of the fin of the first FinFET device.

6. The semiconductor component of claim 1, wherein a conductive type of the epitaxy source/drain region of the first FinFET device is the same as a conductive type of the epitaxy source/drain region of the second FinFET device.

7. The semiconductor component of claim 1, wherein a conductive type of the epitaxy source/drain region of the first FinFET device is different from a conductive type of the epitaxy source drain region of the second FinFET device.

8. A semiconductor component, comprising:
a substrate having a first zone and a second zone;
a plurality of fins disposed on the substrate;
at least two first epitaxy structures disposed on adjacent two of the fins, wherein the first epitaxy structures are in the first zone and are isolated from each other;
an insulating layer having a first portion conformally extending along a sidewall of one of the first epitaxy structures, a second portion conformally extending along a sidewall of another of the first epitaxy structures, and a third portion interconnecting the first portion and the second portion, wherein a bottommost portion of the third portion of the insulating layer is higher than a bottommost portion of the first epitaxy structures; and
at least two second epitaxy structures disposed on other adjacent two of the fins, wherein the second epitaxy structures are in the second zone and are merged.

9. The semiconductor component of claim 8, wherein the first epitaxy structures are fin-shaped.

10. The semiconductor component of claim 8, wherein a width of each of the first epitaxy structures is smaller than a width of each of the second epitaxy structures.

11. The semiconductor component of claim 8, wherein the insulating layer is a silicon oxycarbonitride (SiOCN) film.

12. The semiconductor component of claim 8, further comprising:
a plurality of contacts respectively connected to the first epitaxy structures, wherein an interface between each of the contacts and each of the first epitaxy structures comprises at least one curved section.

13. The semiconductor component of claim 8, further comprising:
a contact connected to the first epitaxy structures, wherein an interface between the contacts and the first epitaxy structures comprises a plurality of curved sections.

14. The semiconductor component of claim 8, further comprising:
an isolation structure between said two of the fins, wherein the third portion of the insulating layer conformally extends along a top surface of the isolation structure.

15. A semiconductor component, comprising:
a substrate;
a plurality of fins disposed on the substrate;
an isolation structure surrounding the fins;
first and second epitaxy structures disposed on the fins, wherein the first and second epitaxy structures are isolated from each other;
an insulating layer having a first portion conformally extending along a first portion of a top surface of the isolation structure and a second portion conformally extending along a sidewall of the first epitaxy structure, wherein the first portion of the insulating layer terminates prior to reaching a second portion of the top surface of the isolation structure, such that the second portion of the top surface of the isolation structure and a sidewall of the second epitaxy structure are free from coverage by the insulating layer; and
a contact disposed on the first epitaxy structure, wherein the first epitaxy structure is partially embedded in the contact.

16. The semiconductor component of claim 15, wherein an interface between the contact and the first epitaxy structure comprises a curved section.

17. The semiconductor component of claim 15, wherein the first epitaxy structure is fin-shaped.

18. The semiconductor component of claim 15, further comprising a dielectric layer disposed between the insulating layer and the contact.

19. The semiconductor component of claim 15, wherein the first epitaxy structure has a bottom portion surrounded by the insulating layer and a top portion over the insulating layer, and the top portion of the first epitaxy structure is in contact with the contact.

20. The semiconductor component of claim 19, wherein a width of the top portion of the first epitaxy structure is greater than a width of the bottom portion of the first epitaxy structure.

* * * * *